(12) United States Patent
Fleischer

(10) Patent No.: US 6,636,056 B1
(45) Date of Patent: Oct. 21, 2003

(54) APPARATUS AND METHOD FOR TESTING INTEGRATED CIRCUITS

(75) Inventor: Siegfried Fleischer, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 108 days.

(21) Appl. No.: 09/693,339

(22) Filed: Oct. 20, 2000

(51) Int. Cl.[7] .............................................. G01R 31/308
(52) U.S. Cl. ..................... 324/753; 324/752; 250/341.4
(58) Field of Search ............................ 324/753, 158.1, 324/754, 758, 765, 763, 73.1, 751, 752, 750; 250/227.17; 714/733, 734; 385/14, 15, 18

(56) References Cited

U.S. PATENT DOCUMENTS

| 5,872,360 A | * | 2/1999 | Paniccia et al. ............ 324/753 |
|---|---|---|---|
| 6,049,639 A | | 4/2000 | Paniccia et al. ............... 385/14 |
| 6,052,498 A | | 4/2000 | Paniccia ....................... 385/14 |
| 6,072,179 A | * | 6/2000 | Paniccia et al. ............ 324/753 |
| 6,075,908 A | | 6/2000 | Paniccia et al. ............... 385/14 |
| 6,201,235 B1 | * | 3/2002 | Takeuchi et al. ............ 324/753 |
| 6,232,765 B1 | * | 5/2002 | Takeuchi et al. ............ 324/753 |

* cited by examiner

Primary Examiner—Kamand Cuneo
Assistant Examiner—Jimmy Nguyen
(74) Attorney, Agent, or Firm—Schwegman, Lundberg, Woessner & Kluth, P.A.

(57) ABSTRACT

A method and apparatus for testing the operability of a signal source formed on a die are described. A pair of modulators are formed on the die and coupled to the signal source. An optical unit is optically coupled to the pair of modulators, which are capable of modulating an optical beam in response to a signal provided by the signal source. The optical unit is capable of detecting modulation of the optical beam. To test the signal source, the signal source is set to generate a signal. If modulation of the optical beam is detected at the optical unit, then the signal source is operable. If modulation of the optical beam is not detected at the optical unit, then the signal source is not operable.

29 Claims, 10 Drawing Sheets

APPARATUS AND METHOD FOR TESTING INTEGRATED CIRCUITS

FIELD

The present invention relates to integrated circuits, and more particularly, the present invention relates to testing integrated circuits.

BACKGROUND

Integrated circuits, such as processors and application specific integrated circuits, are routinely fabricated from millions of signal sources, such as logic gates. The interconnections that couple logic gates together are called nodes. One or more logic gates may be coupled to a node. During the operation of a digital integrated circuit, the nodes carry signals that have positive and negative logic levels. In testing a digital integrated circuit, input signals are provided to the integrated circuit and the signals at each node are monitored to determine whether the circuit is operating correctly. Specifically, for a digital integrated circuit, each node must be capable of assuming a positive logic level and a negative logic level. For nodes in a digital integrated circuit not connected to an output pad, the positive and negative logic levels cannot be measured directly. Therefore, testing the operation of a particular node in an integrated circuit often requires identifying a sequence of input signals to the integrated circuit that causes a change in the logic level at the particular node and that also causes a corresponding change in the logic level at an output pad not directly connected to the particular node. Unfortunately, in many integrated circuits some nodes are not testable in this way because a pattern of signals does not exist for changing the logic level of a particular node and having the change in logic level reflected at an output pad not directly connected to the particular node.

Integrated circuits can be fabricated with optical switching devices providing backside optical input/output (I/O). An integrated circuit is typically formed on one side of a substrate. The side of the substrate opposite from the side on which the integrated circuit is typically formed or located is the backside of the substrate. Backside optical I/O is provided by optical switching devices fabricated on the backside of a substrate. Optical switching devices do not require output pads in order to couple output signals to circuits external to the integrated circuit and the die. The output signals from optical switching devices can be coupled to circuits external to a die through an optical beam. Optical switching devices can also be connected to nodes in the integrated circuit. Specifically, optical switching devices can be connected to nodes that are not testable through I/O pads. FIG. 1 is an illustration of a prior art system 100 for testing a signal source 102 using an optical switching device 104. The optical switching device 104 may be fabricated from a pn-junction or a metal-oxide semiconductor (MOS) gate. If device 104 is fabricated from a pn-junction and a laser beam 106 is coupled to the pn-junction through the backside of silicon die 108, then the reflected beam 110 is produced at the pn-junction. If an electrical signal from signal source 102 is applied to the pn-junction while laser beam 106 is coupled to the pn-junction, then reflected beam 110 is modulated by the electrical signal and includes the information contained in the electrical signal. Similarly, if the optical switching device 104 fabricated from a MOS gate having a charge layer and the laser beam 106 is coupled to the charge layer through the backside of silicon die 108, then the reflected beam 110 is generated at the charge layer. If an electrical signal from signal source 102 is applied to the charge layer while laser beam 106 is coupled to the charge layer, then reflected beam 110 is modulated by the electrical signal and includes the information contained in the electrical signal. For optical switching device 104, reflected beam 110 is converted to detected signal 114 at an output port of detector 116.

Unfortunately, several problems arise in attempting to recover the information contained in reflected beam 110. First, the modulation of reflected beam 110 is small, so reflected beam 110 has a low signal-to-noise ratio, which decreases the probability of correctly detecting the information contained in reflected beam 110. Second, since reflected beam 110 has a low signal-to-noise ratio, detected signal 114, which is generated at detector 116 from reflected beam 110, is sensitive to the alignment of reflected beam 110 with detector 116. Any misalignment between reflected beam 110 and detector 116 decreases the probability of correctly detecting the information contained in reflected beam 110. Third, since the refractive index of silicon varies with temperature, temperature changes in the integrated circuit cause the direct current component of the signal generated at detector 116 to drift. Drift at detector 116 also decreases the probability of correctly detecting the information contained in reflected beam 110 and is a significant problem in attempting to decode phase encoded information from reflected beam 110. Finally, each of the above described problems increases the difficulty of successfully testing a logic node through a single backside I/O device.

For these and other reasons there is a need for the present invention.

DESCRIPTION

In the following description, for purposes of explanation, numerous specific details are set forth in order to provide a thorough understanding of the present invention. It will be evident, however, to one skilled in the art that the present invention may be practiced without these specific details. In other instances, well known manufacturing processes and methods have not been described in order to not obscure the present invention.

A method and apparatus for monitoring a signal source are described. A signal source formed on a die is monitored by coupling an output signal generated by the signal source and an optical beam generated external to the die to a pair of optical modulators. The optical beam is reflected at the optical modulators to generate a return beam, which is modulated by the signal generated by the signal source. The modulation on the return beam permits monitoring of the operation of the signal source.

Figure 2:
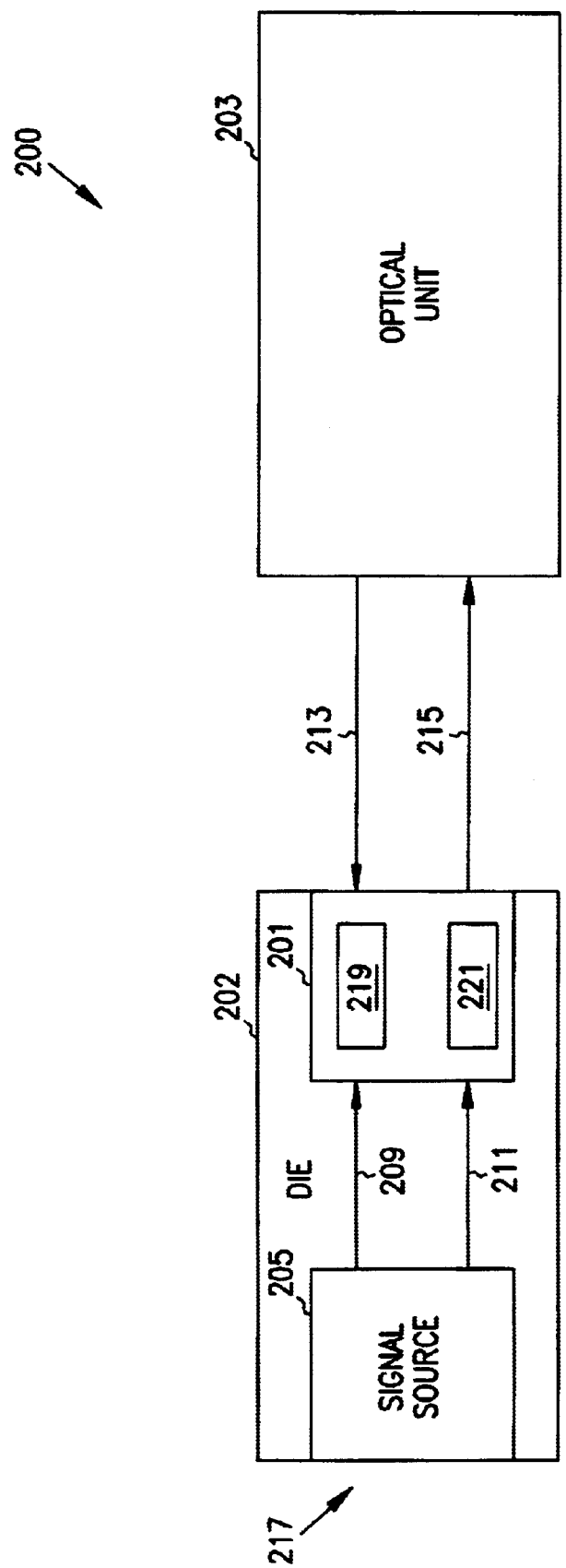
FIG. 2 is a block diagram of one embodiment of an apparatus for testing signal sources in accordance with the present invention and for practicing the method of the present invention.

FIG. 2 is a block diagram of one embodiment of apparatus 200 according to the present invention. Apparatus 200 comprises a pair of modulators 201 formed on a die 202 and an optical unit 203. Die 202 provides a substrate for the fabrication of electronic circuits. In one embodiment of the present invention, a signal source 205 and the pair of modulators 201 are formed on die 202. Signal source 205 is capable of providing a first signal 209 and a second signal 211 to the pair of modulators 201. In one embodiment of the present invention, first signal 209 and second signal 211 are complementary signals. For example, if first signal 209 has a logical one value, then second signal 211 has a logical zero value, and if first signal 209 has a logical zero value, then second signal 211 has a logical one value. The pair of modulators 201 are capable of being coupled to optical unit 203 by first optical path 213 and second optical path 215.

Die 202 is preferably fabricated from a semiconductor, however die 202 is not limited to being fabricated from a particular type of semiconductor. Any semiconductor capable of being used in connection with the fabrication of transistors, logic circuits, such as AND gates, OR gates, NAND gates, NOR gates, or memory circuits, is suitable for use in connection with the present invention. Silicon, germanium, and gallium arsenide are exemplary semiconductor materials suitable for use in the fabrication of die 202.

Signal source 205 is preferably fabricated on a frontside 217 of die 202. Frontside 217 is the side on which the functional circuits of die 202 are fabricated. For example, if a processor is fabricated on die 202, then the circuits that form the arithmetic and logic unit, the memory unit, and the input/output (I/O) control unit are fabricated on the frontside 217 of die 202.

Signal source 205 is an electronic device, such as a transistor, a logic circuit, such as an AND gate, an OR gate, a NAND gate, a NOR gate, or a memory circuit, which is capable of generating a logic signal. For a digital system, a logic signal is capable of having a logical "zero" value or a logical "one" value. The transistor, logic gate, or memory circuit used in connection with the present invention is not limited to being fabricated using a particular technology. In one embodiment, the transistor, logic gate, or memory circuit is fabricated using a complementary metal-oxide semiconductor (CMOS) fabrication processes. In an alternate embodiment, the transistor, logic gate, or memory circuit is fabricated using a bipolar fabrication processes.

The pair of modulators 201 includes a first modulator 219 and a second modulator 221. Any circuit or device, such as a phototransistor or a phototransistor based circuit, capable of modulating an optical beam in response to a logic signal is suitable for use in connection with the present invention as the first modulator 219 and the second modulator 221. FIGS. 3A, 3B, 3C, and 3D illustrate exemplary embodiments of modulators suitable for use as the first modulator 219 and the second modulator 221 in connection with the present invention.

Figure 3A:
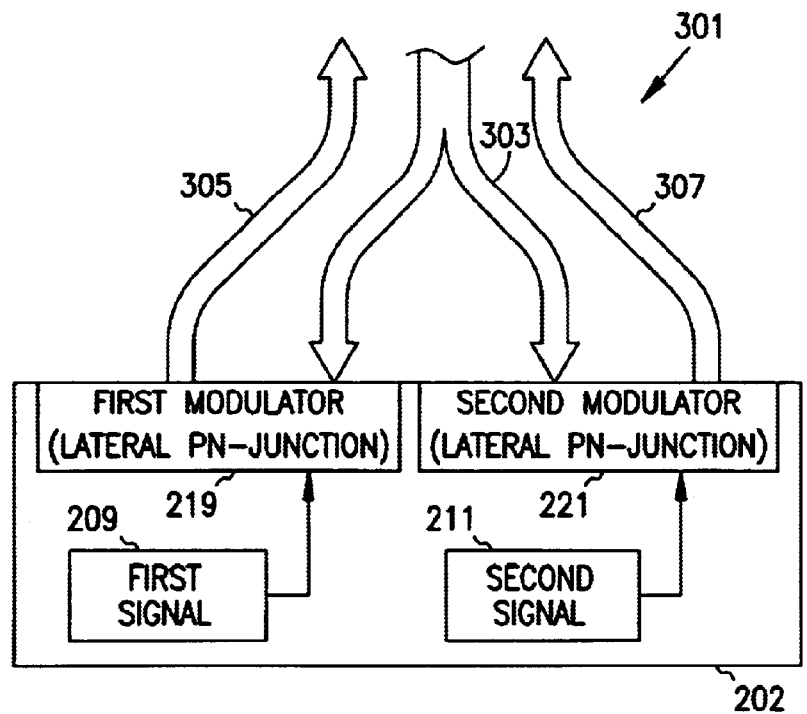
FIGS. 3A–3D are illustrations of configurations for alternate embodiments of modulators suitable for use in connection with the apparatus and method of the present invention.

FIG. 3A is an illustration of a pair of lateral pn-junction modulators 301 formed on die 202. In one embodiment, the first modulator 219 and the second modulator 221 comprise lateral pn-junction modulators. As shown in FIG. 3A, first signal 209 is coupled to the first modulator 219, second signal 211 is coupled to the second modulator 221, and an optical beam 303 is imaged at each pn-junction. In operation, second signal 211 is the complement of first signal 209. In response to the first signal 209 and the second signal 211, one lateral pn-junction modulator of the pair of lateral pn-junction modulators is forward biased and one lateral pn-junction modulator of the pair of lateral pn-junction modulators is reversed biased. The forward biased lateral pn-junction modulator returns an optical beam having a greater intensity than the optical beam returned by the reverse biased lateral pn-junction modulator. For example, if first modulator 219 is forward biased and second modulator 221 is reversed biased, then optical beam 305 returned from first modulator 219 has a greater intensity than optical beam 307 returned.from second modulator 221.

Figure 3B:
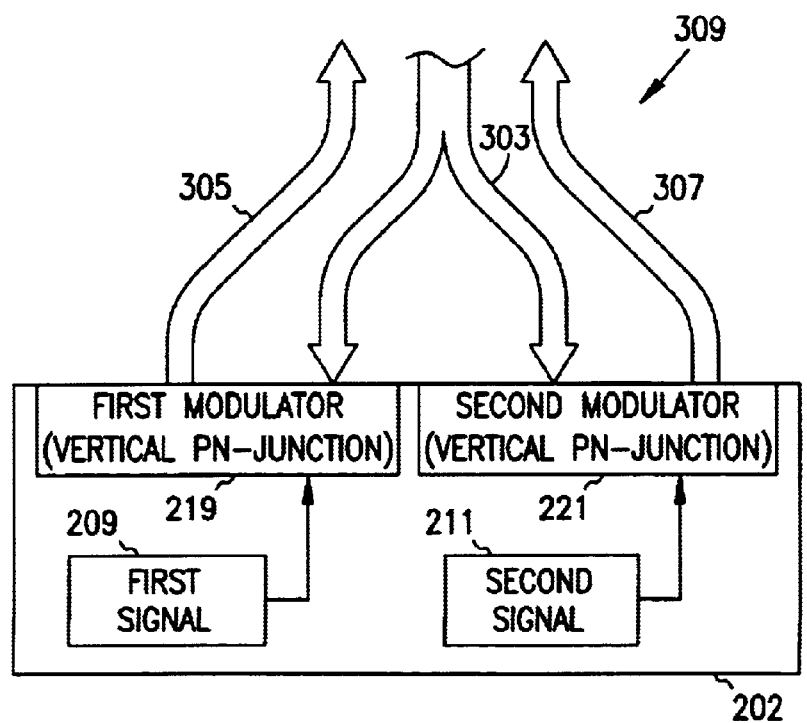

FIG. 3B is an illustration of a pair of vertical pn-junction modulators 309 formed on die 202. In one embodiment, the first modulator 219 and the second modulator 221 comprise vertical pn-junction modulators. As shown in FIG. 3B, first signal 209 is coupled to the first modulator 219, second signal 211 is coupled to the second modulator 221, and an optical beam 303 is imaged at each of the vertical pn-junctions. In operation, second signal 211 is the complement of first signal 209. In response to the first signal 209 and the second signal 211, one vertical pn-junction modulator of the pair of vertical pn-junction modulators is forward biased and one vertical pn-junction modulator of the pair of vertical pn-junction modulators is reversed biased. The forward biased vertical pn-junction modulator returns an optical beam having a greater intensity than the optical beam returned by the reverse biased vertical pn-junction modulator. For example, if first modulator 219 is forward biased and second modulator 221 is reversed biased, then optical beam 305 returned from first modulator 219 has a greater intensity than optical beam 307 returned from second modulator 221.

Figure 3C:
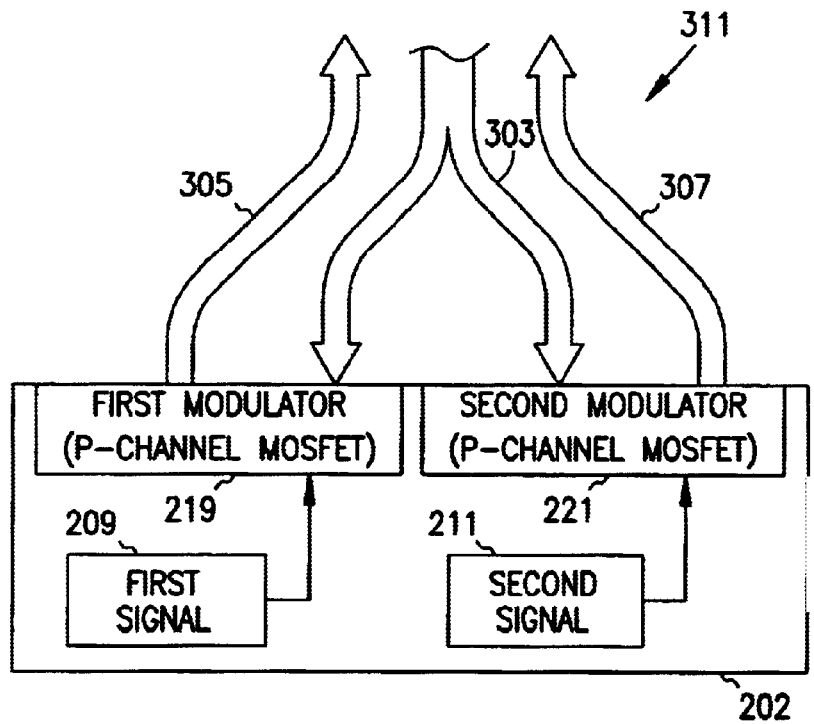

FIG. 3C is an illustration of a pair of p-channel metal-oxide semiconductor field-effect transistor (MOSFET) modulators 311 formed on die 202. In one embodiment, the first modulator 219 and the second modulator 221 comprise p-channel metal-oxide semiconductor field-effect transistor (MOSFET) modulators. As shown in FIG. 3C, first signal 209 is coupled to the first modulator 219, second signal 211 is coupled to the second modulator 221, and the optical beam 303 is imaged at the gate of first modulator 219 and second modulator 221. In operation, second signal 211 is the complement of first signal 209 and the pair of p-channel metal-oxide semiconductor field-effect transistor (MOSFET) modulators 311 is each configured to operate as a MOSFET transistor. The optical beam 303 is imaged at the gate of first modulator 219 and second modulator 221, and first signal 209 is coupled to the gate of first modulator 219 and the second signal 211 is coupled to the gate of the second modulator 221. In response to the first signal 209 and the second signal 211, one of the pair of p-channel metal-oxide semiconductor field-effect transistor (MOSFET) modulators 311 is conducting and one of the pair of p-channel metal-oxide semiconductor field-effect transistor (MOSFET) modulators 311 is cut-off. The p-channel metal-oxide semiconductor field-effect transistor (MOSFET) modulator that is conducting returns a beam having a greater intensity than the p-channel metal-oxide semiconductor field-effect transistor (MOSFET) modulator that is cut-off. For example, if first modulator 219 is conducting and second modulator 221 is cutoff, then optical beam 305 returned from first modulator 219 has a greater intensity than optical beam 307 returned from second modulator 221.

Figure 3D:
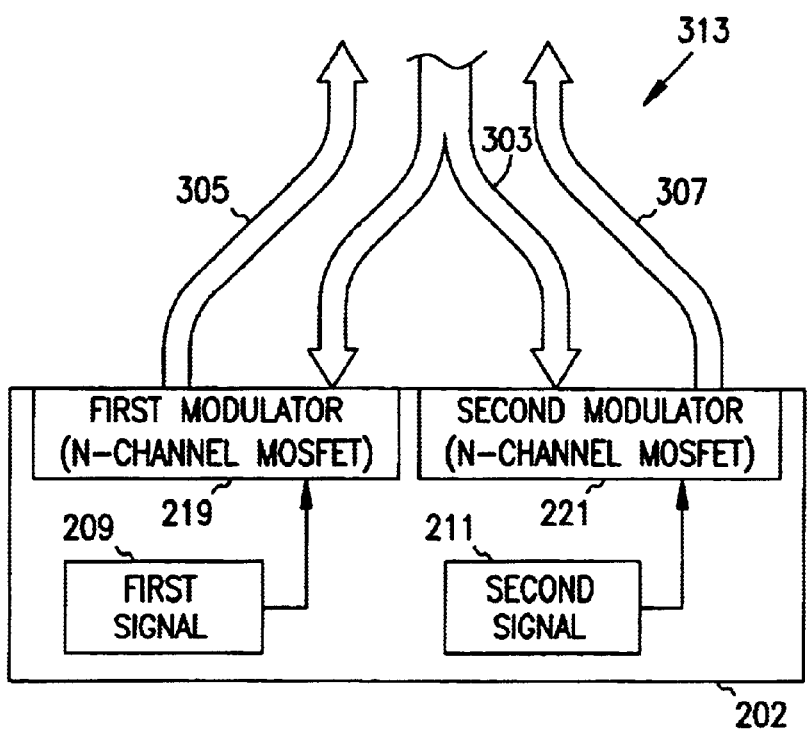

FIG. 3D is an illustration of a pair of n-channel metal-oxide semiconductor field-effect transistor (MOSFET) modulators 313 formed on die 202. In one embodiment, the first modulator 219 and the second modulator 221 comprise n-channel metal-oxide semiconductor field-effect transistor (MOSFET) modulators. In the operation of the pair of n-channel metal-oxide semiconductor field-effect transistor (MOSFET) modulators 313, an optical beam is imaged at the gate of first modulator 219 and second modulator 221, and the first signal 209 is coupled to the gate of first modulator 219 and the second signal 211 is coupled to the gate of the second modulator 221. In operation, second signal 211 is the complement of first signal 209. In response to the first signal 209 and the second signal 211, one of the pair of pair of n-channel metal-oxide semiconductor field-effect transistor (MOSFET) modulators 313 is conducting and one of the pair of n-channel metal-oxide semiconductor field-effect transistor (MOSFET) modulators 313 is cut-off. The n-channel metal-oxide semiconductor field-effect transistor (MOSFET) modulator 313 that is conducting returns a beam having a greater intensity than the n-channel metal-oxide semiconductor field-effect transistor (MOSFET) modulator 313 that is cut-off. For example, if first modulator 219 is conducting and second modulator 221 is cutoff, then optical beam 305 returned from first modulator 219 has a greater intensity than optical beam 307 returned from second modulator 221.

Figure 4:
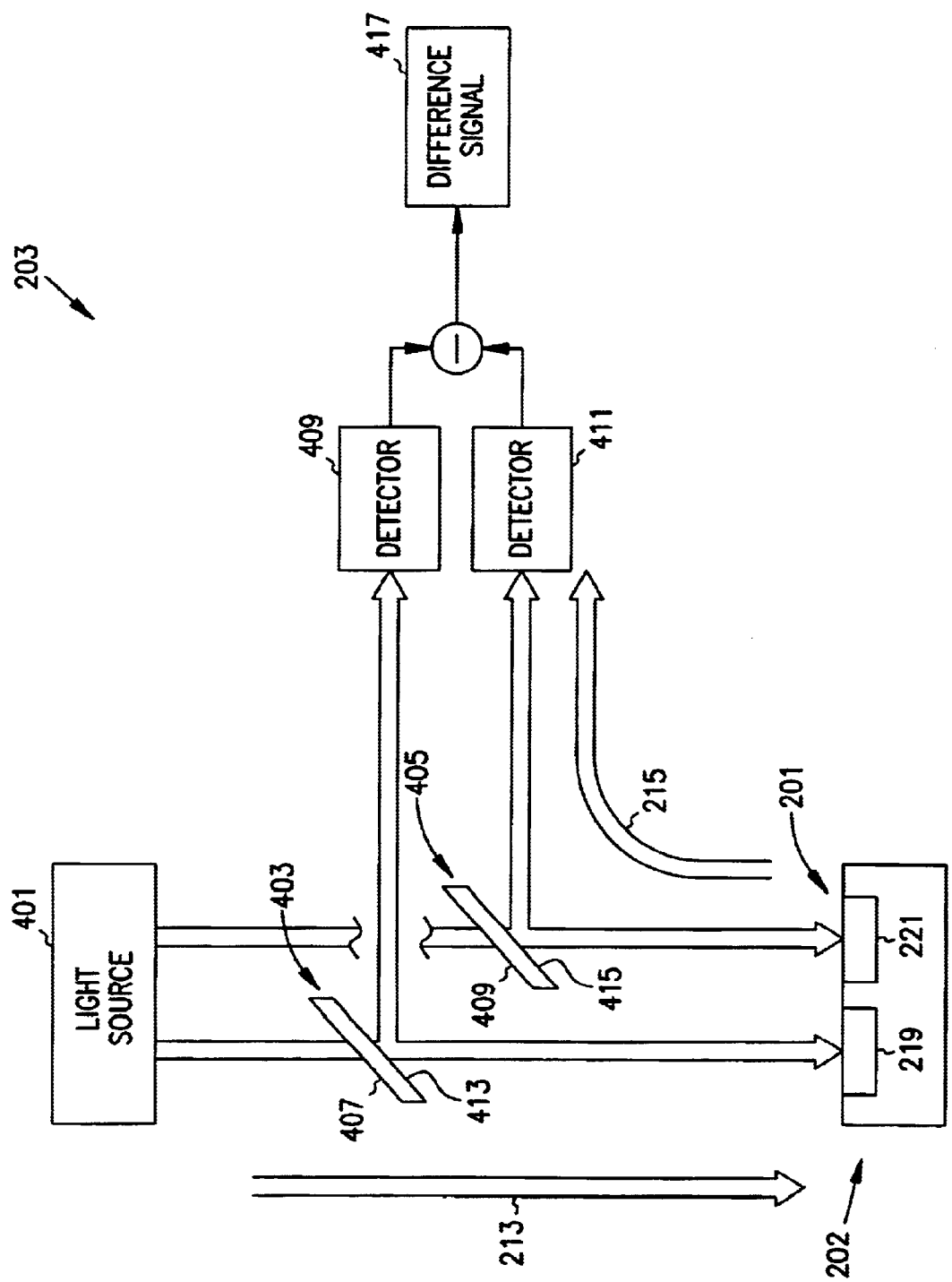
FIG. 4 is an illustration of one embodiment of a first optical path and a second optical path according to the present invention.

FIG. 4 is an illustration of one embodiment of optical unit 203 including the first optical path 213 and the second optical path 215 according to the present invention. The first optical path 213 includes a light source 401, a first beam splitter 403, a second beam splitter 405, and a pair of modulators 201 including the first modulator 219 and the second modulator 221. Light source 401 generally operates at a frequency for which die 202 is transparent. In one embodiment, the light source 401 is a laser operating in the infrared region of the electromagnetic spectrum. The first beam splitter 403 and the second beam splitter 405 are fabricated such that the optical beam generated by the light source 401 is transmitted when passing through a front face 407 of the first beam splitter 403 or a front face 409 of the second beam splitter 405. In operation, an optical beam from the light source 401 passes through the front face 407 of the first beam spitter 403 and the front face 405 of the second beam splitter 409, and is imaged at the first modulator 219 and the second modulator 221.

Still referring to FIG. 4, the second optical path 215 includes the first modulator 219 and the second modulator 221, the first beam splitter 403 and the second beam splitter 405, and a first detector 409 and a second detector 411. The first beam splitter 403 and the second beam splitter 405 are fabricated such that an optical beam directed to the back face 413 of the first beam splitter 403 and the back face 415 of the second beam splitter 405 is reflected. In operation, an optical beam reflected from the pair of modulators 201 is also reflected by the back face 413 of the first beam splitter 403 and the back face 415 of the second beam splitter 405. The optical beam terminates at the first detector 409 and the second detector 411, which are preferably photodetectors.

Signals generated at the first detector 409 and the second detector 411 are processed by generating a difference signal 417. In one embodiment the difference signal 417 is a digital signal. The amplitude of a difference signal 417 is capable of functioning as an indicator of whether the forward beam is modulated at the pair of modulators 201.

Figure 1:
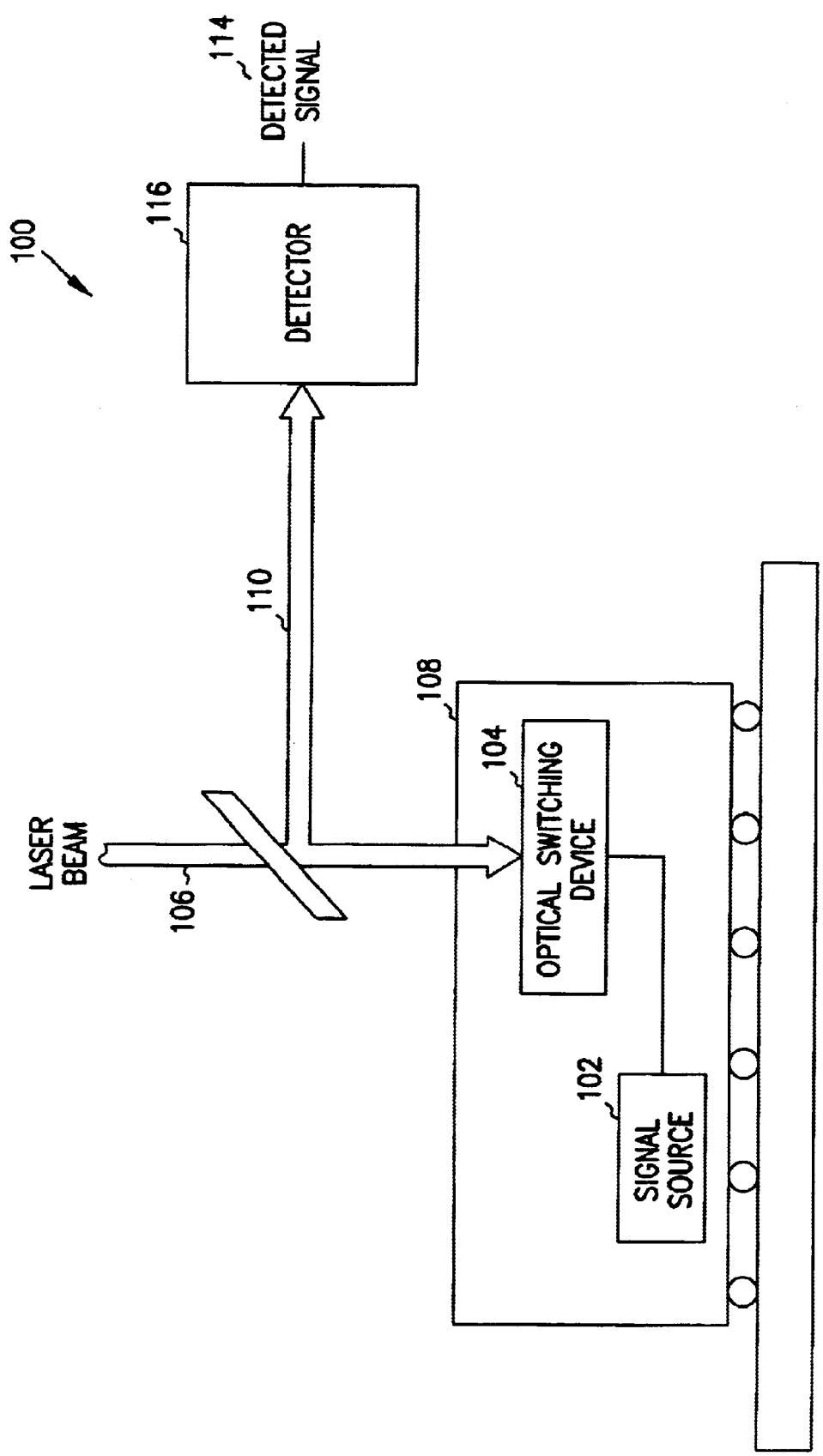
FIG. 1 is an illustration of a prior art system for optically detecting a signal from a backside I/O device.

The embodiment shown in FIG. 4 is particularly well suited to detect amplitude modulation in an amplitude modulated signal and provides an improved signal-to-noise ratio over the prior art system shown in FIG. 1. The first modulator 219 and the second modulator 221 are driven by the first signal 209 and second signal 211, which is the complement of first signal 209, so the imposed relative modulation on the two beams have opposite sign. Comparing the imposed modulation of the beam reflected from first modulator 219 and second modulator 221 yields a twofold increase in the signal size, which results in an improved signal-to-noise ratio for difference signal 417 when compared to the difference signal of the prior art system shown in FIG. 1. The improved signal-to-noise ratio permits small alignment errors in the optical components that comprise optical path 215. Single modulator systems, such as the prior art system shown in FIG. 1, are not capable of tolerating such alignment errors.

Figure 5:
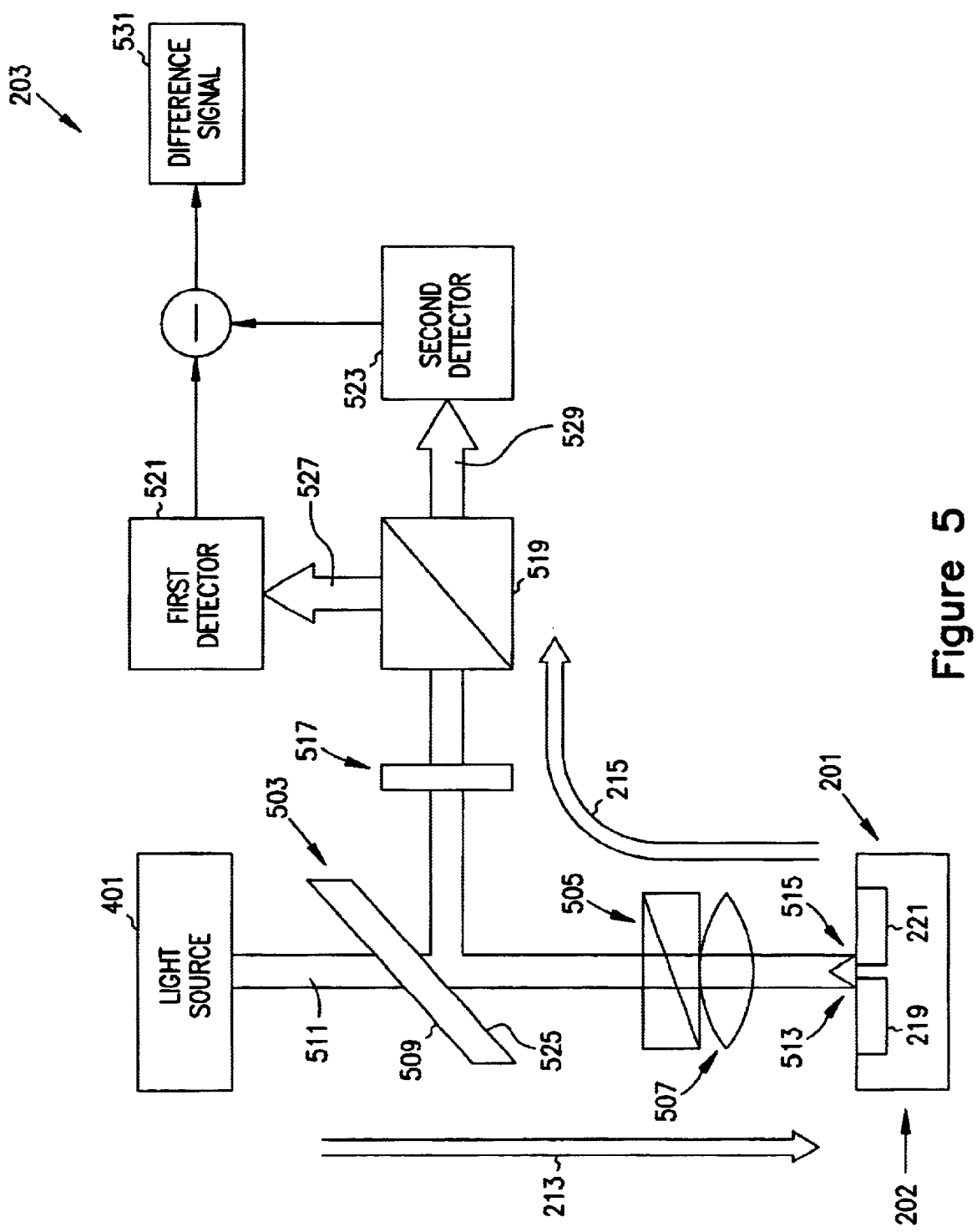
FIG. 5 is an illustration of an alternate embodiment of a first optical path and a second optical path according to the present invention.

FIG. 5 is an illustration of an alternate embodiment of optical unit 203 including a first optical path 213 and a second optical path 215 according to the present invention. The first optical path 213 includes a light source 401, abeam splitter 503, a prism 505, a lens 507, and the pair of modulators 201 including the first modulator 219 and the second modulator 221. Generally, light source 401 operates at a frequency at which die 202 is transparent. In one embodiment, the light source 401 is a laser having a wavelength of between about 1 micron and about 2.5 microns. The beam splitter 503 is fabricated to have a front face 509 such that the optical beam generated by the light source 401 is transmitted by front face 509 of the beam,splitter 503. Prism 505, in one embodiment, is a Wollaston prism. Lens 507 is a focusing lens which when combined with prism 505 separates a single optical beam into two optical beams. In operation, an optical beam 511 generated by the light source 401 passes through the front face 509 of the first beam spitter 503, through prism 505, and through lens 507. The prism 505 and the lens 507 divide the optical beam 511 into a first beam 513 and a second beam 515 which terminate at the first modulator 219 and the second modulator 221, respectively.

Still referring to FIG. 5, the second optical path 215 includes the first modulator 219 and the second modulator 221, the lens 507, the prism 505, the beam splitter 503, a wave plate 517, a polarizer 519, a first detector 521 and a second detector 523. The beam splitter 503 is fabricated such that an optical beam is reflected by the back surface 525 of the beam splitter 503. In operation, the first beam 513 and the second beam 515 are reflected from the pair of modulators 201, and travel along the second optical path 503 passing through the lens 507, the prism 505, reflecting off the back surface 525 of the beam splitter 503, passing through wave plate 517, passing through polarizer 519 which generates a first optical signal 527 and a second optical signal 529 which terminate at the first detector 521 and the second detector 523, respectively. The output signals from the first detector 521 and second detector 523 are processed to generate a difference signal 531. The amplitude of a difference signal 531 is capable of functioning as an indicator of the degree of modulation at the pair of modulators 201. The signal-to-noise ratio of the difference signal 417 is improved over the signal-to-noise ratio obtained in a single modulator system that does not include the first signal 209 and the second signal 211.

In general, a phase modulated signal is produced by delaying a signal. The delayed or phase modulated signal includes zero crossings that are shifted when compared to the signal zero crossings. Optical unit 203 shown in FIG. 5 is particularly well suited to detect phase modulation and to provide a high level of noise immunity when compared with the prior art system shown in FIG. 1. Optical systems capable of detecting phase modulation, such as optical unit 203 shown in FIG. 5, are sometimes referred to as interferometers. In an interferometer, path length changes, such as changes caused by vibration or temperature changes, are common to both beams and will cancel. Laser noise, which is also common to both beams is also canceled in optical unit 203 shown in FIG. 5.

Figure 6:
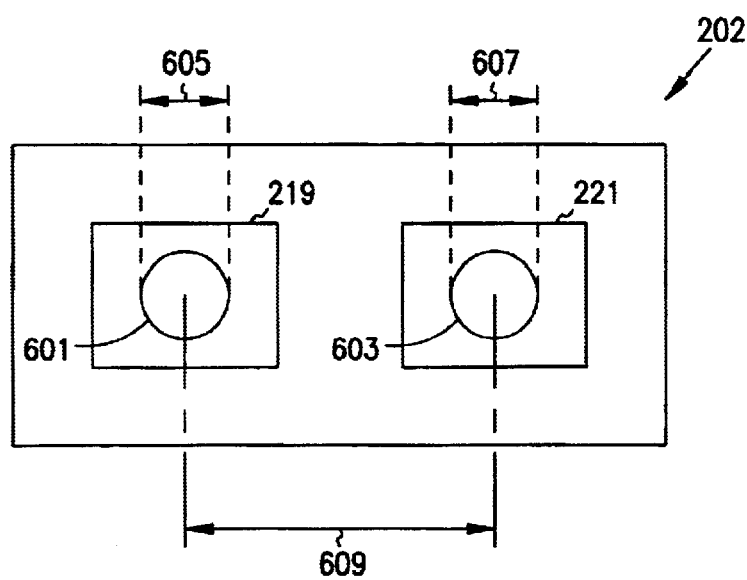
FIG. 6 is an illustration of a top view of a die including a beam spot at a first modulator and a second modulator.

FIG. 6 is an illustration of a top view of the back surface of die 202 showing beam spot 601 superimposed on the first modulator 219 and beam spot 603 superimposed on the second modulator 221. Each of the beam spots 601 and 603 has an area that is generally less than the area of either the first modulator 219 or the second modulator 221. First beam spot 601 has a diameter 605 and second beam spot 603 has a diameter 607. Preferably, first beam spot diameter 605 is about equal to second beam spot diameter 607, and diameter 607 is preferably between about 1.6 microns and 3 microns. As shown in FIG. 6, the first modulator 219 and the second modulator 221 are formed close together on die 202. Forming the first modulator 219 close to second modulator 221 on die 202 helps to ensure that the first modulator 219 and the second modulator 221 both track to the same temperature changes in die 202. Tracking the same temperature changes reduces variance in the index of refraction between first modulator 219 and second modulator 221. The first modulator 219 and the second modulator 221 have a separation distance 609 that is the distance between the center of the first modulator 219 and the center of the second modulator 221. The separation distance 609 is preferably about equal to twice the beam spot diameter. However, separation distance 609 also may be greater than twice the beam spot diameter.

Referring again to FIG. 2, in operation, optical unit 203 of apparatus 200 provides an optical beam that travels along the first optical path 213 to the pair of modulators 201. The first signal 209 and the second signal 211 drive the pair of modulators 201 which modulate the optical beam to form a return beam. The return beam travels along the second optical path 215. If signal source 205 is generating a signal, then the return beam is modulated by the first signal 209 and the second signal 211. The modulated return beam is detected at optical unit 203. In this way signal sources fabricated on die 202 and coupled to the pair of modulators 201 can be monitored or tested, even when the signal sources are not coupled to input/output (I/O) pads on die 202. Those skilled in the art will recognize that the present invention is not limited in the number of signal sources that can be coupled to backside optical I/O devices.

FIGS. 7A–7E show exemplary voltage versus time graphs of signals generated by signal source 205 on die 202 and by optical unit 203 during the operation of apparatus 200 shown in FIG. 2.

Figure 7A:
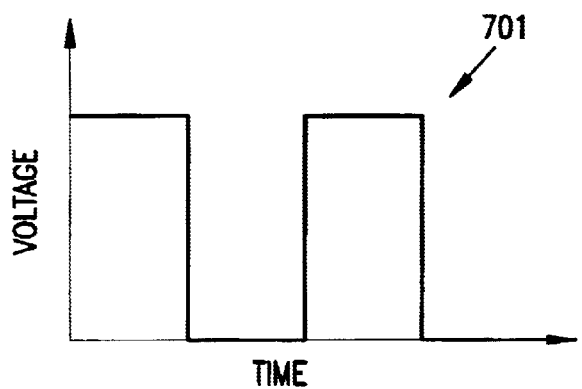
FIGS. 7A–7E are exemplary graphs of signal inputs to a modulator and the resulting difference signal produced according to the present invention.
Figure 7B:
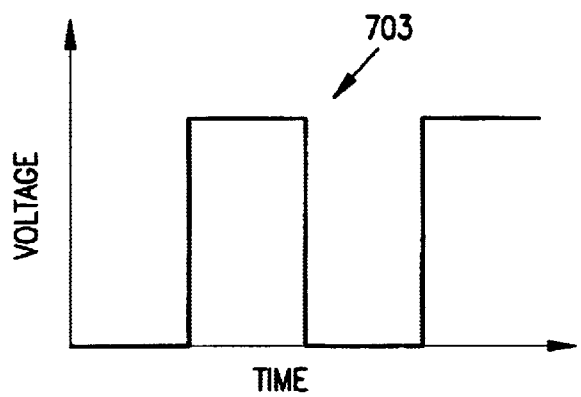

Signal source 205 generates first signal 209 and second signal 211, as shown in FIG. 2. FIG. 7A shows a graph of one embodiment of first signal 205 as first oscillating test signal 701. FIG. 7B shows a graph of one embodiment of second signal 209 as second oscillating test signal 703, which is the complement of the first oscillating test signal 701. Although FIGS. 7A and 7B show first oscillating test signal 701 and second oscillating test signal 703 as periodic signals in order to clearly illustrate the complementary nature of the signals, the present invention is not limited to periodic signals. Any pair of complementary signals are suitable for use in connection with the present invention as first signal 209 and second signal 211.

Figure 7C:
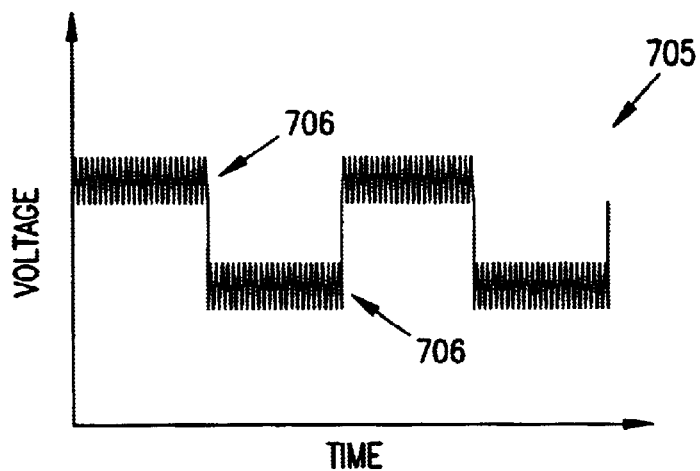
Figure 7D:
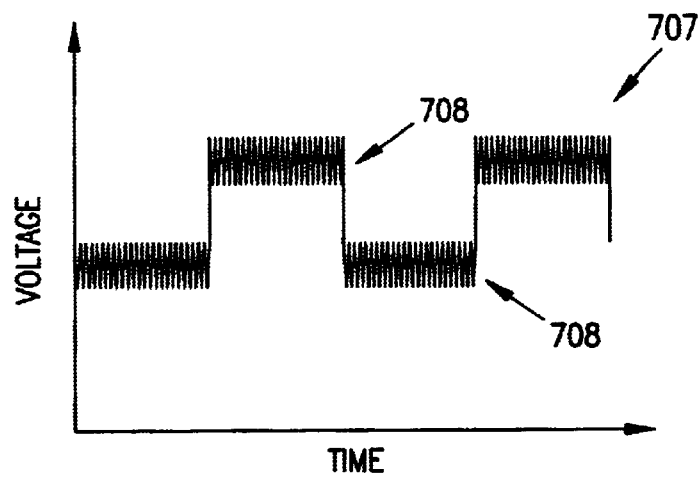
Figure 7E:
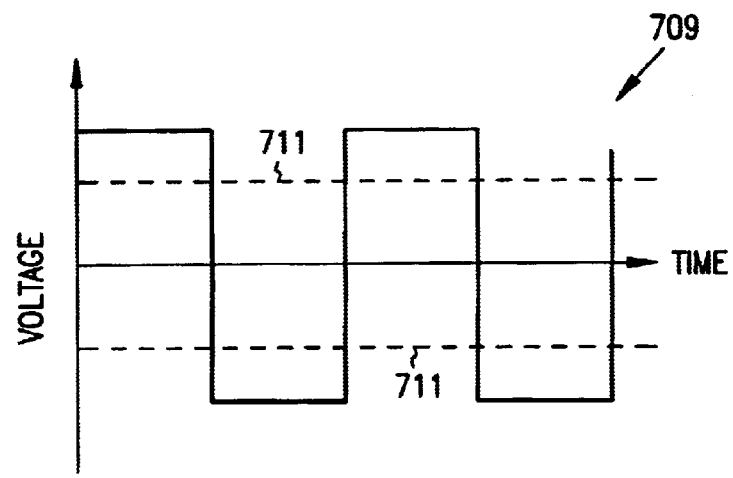

FIG. 7C and FIG. 7D show voltage versus time graphs of exemplary signals generated at the output ports of detectors 409 and 411 (shown in FIG. 4) during the time that the first oscillating test signal 701 and the second oscillating test signal 703 are provided to. the pair of modulators 201 (shown in FIGS. 2 and 4). FIG. 7C shows a first detector signal 705 including common mode noise component 706, and a second detector signal 707 including common mode noise component 708. First detector signal 705 is an output of detector 409 (shown in FIG. 4), and a second detector signal a 707 is an output of detector 411 (shown in FIG. 4). FIG. 7E shows a difference signal 709 which is formed by subtracting second detector signal 707 from first detector signal 705. Since noise component 706 and noise component 707 include common mode noise, the noise is essentially canceled when difference signal 709 is formed.

FIG. 7E also shows a threshold level 711. Threshold level 711 is preferably set to value of about 10% less than the anticipated voltage level for difference signal 709. By setting a threshold level 711 and detecting when difference signal 709 exceeds the absolute value of the threshold level 711, the operation of signal source 205 can be inferred. When the difference signal 709 is greater than the absolute value of the threshold level 711, then signal source 205, shown in FIG. 1, is operable. When the difference signal 709 is less than the absolute value of the threshold level 711, then the signal source 205, shown in FIG. 1, is not operable.

Figure 8:
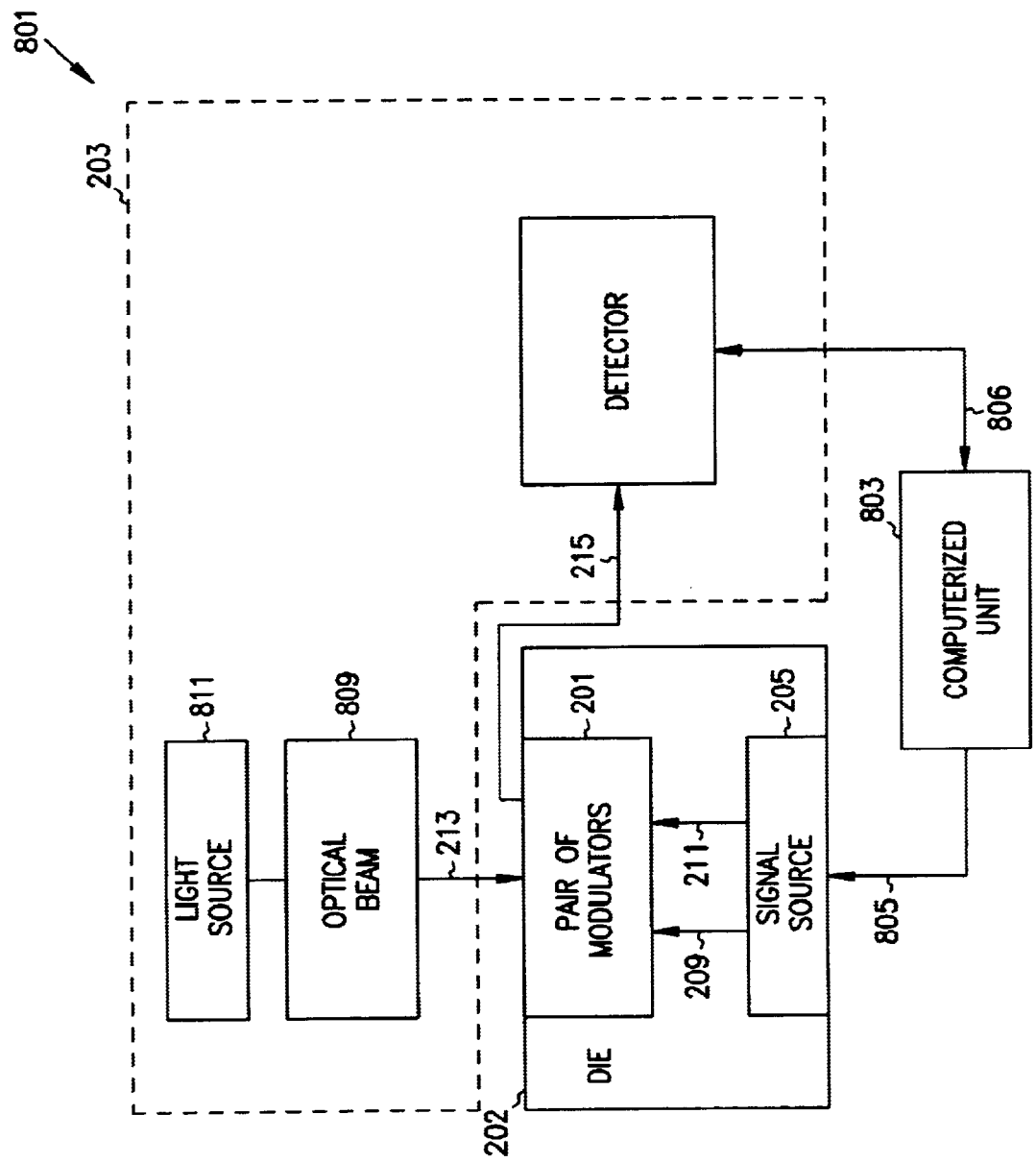
FIG. 8 is an illustration of one embodiment of an apparatus including a processor suitable for use in connection with the present invention.

FIG. 8 is a block diagram of one embodiment of apparatus 801 including a computerized unit 803, such as a processor or a logic analyzer, for use in connection with the present invention. Apparatus 801, as shown in FIG. 8, provides a system for automatically testing the signal source 205 on die 202. Apparatus 801 comprises die 202, optical unit 203, and computerized unit 803. Die 202 includes a signal source 205 which provides first signal 209 and second signal 211 to the pair of modulators 201. Optical unit 203 is coupled to the pair of modulators 211 by first optical path 213 and second optical path 215. Computerized unit 803 is electrically coupled to die 202 and optical unit 203 through connections 805 and 806, respectively. Computerized unit 803 is capable of communicating with signal source 205 over connection 805 and communicating with optical unit 203 over connection 807. In operation, computerized unit 803 provides a signal, such as an oscillating test signal, to drive signal source 205, which in turn generates the first signal 209 and the second signal 211. Optical unit 203 transmits an optical beam 809 generated by light source 811 along first optical path 213 to the pair of modulators 201. The pair of modulators 201 generates and transmits a return beam along second optical path 215. Optical unit 203 processes the return beam to determine whether signal source 205 is operable.

Figure 9:
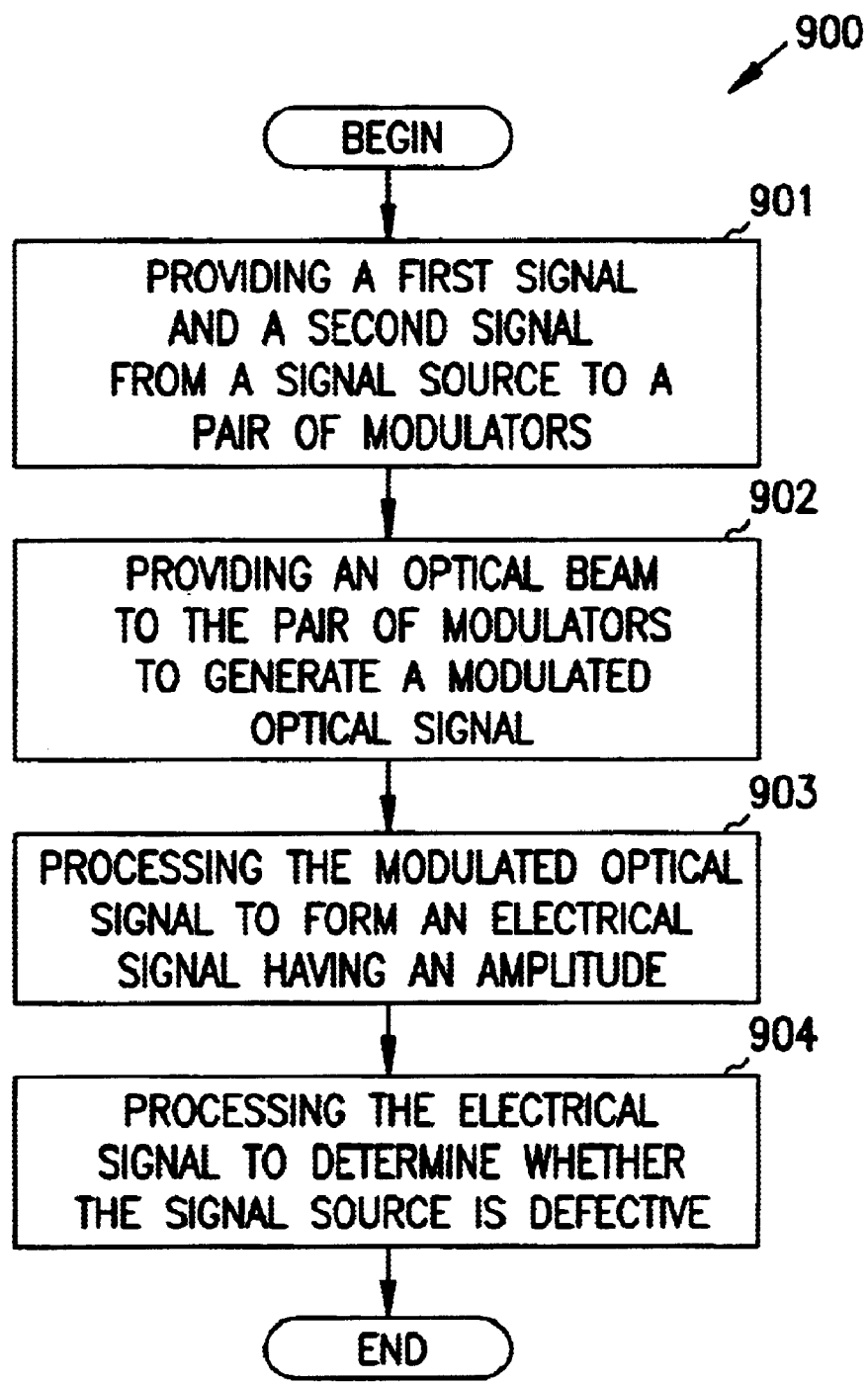
FIG. 9 is a flow diagram of one embodiment of a method of optically detecting a defective signal source.

FIG. 9 is a flow diagram of one embodiment of a method 900 of optically detecting a defective signal source. The method 900 comprises providing a first signal and a second signal from a signal source to a pair of modulators (block 901), providing an optical beam to the pair of modulators to generate a modulated optical signal (block 902), processing the modulated optical signal to form an electrical signal having an amplitude (block 903), and processing the electrical signal to determine whether the signal source is defective (block 904). In an alternate embodiment, providing a first signal and a second signal from a signal source to a pair of modulators comprises providing the first signal comprising an oscillating digital signal, and providing the second signal comprising a complement of the oscillating digital signal. In another alternate embodiment, providing an optical beam to the pair of modulators to generate a modulated optical signal comprises using a laser to generate the optical beam, using a lens to generate a pair of optical beams from the optical beam, and providing the pair of optical beams to the pair of modulators. In still another alternate embodiment, processing the modulated optical signal to form an electrical signal having an amplitude comprises generating a difference signal from a pair of output signals produced by a pair of photodetectors. And in still another alternate embodiment, processing the electrical signal to determine whether the signals source is defective comprises measuring the amplitude of the electrical signal and comparing the amplitude of the electrical signal to a predetermined threshold level, wherein if the amplitude is less than the predetermined threshold level, the signal source is identified as defective.

Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A method for testing a signal source, the method comprising:
   providing a first signal and a second signal to a pair of modulators, the first signal being generated by the signal source and the second signal being a complement of the first signal;
   providing a optical beam to the pair of modulators to generate a modulated optical signal;
   processing the modulated optical signal to form an electrical signal having an amplitude; and
   processing the electrical signal to determine whether the signal source is defective, wherein processing the electrical signal to determine whether the signal source is defective comprises:
     measuring the amplitude of the electrical signal; and
     comparing the amplitude of the electrical signal to a predetermined threshold level, wherein if the amplitude is less than the predetermined threshold level, the signal source is defective.

2. Apparatus comprising:
   a pair of modulators formed on a die and capable of being coupled to a signal source formed on the die; and
   an optical unit capable of being optically coupled to the pair of modulators, the optical unit and the pair of modulators being capable of generating a signal suitable for monitoring the signal source.

3. The apparatus of claim 2, wherein the die includes a backside and the pair of modulators are located on the backside.

4. The apparatus of claim 2, wherein the pair of modulators are capable of receiving the signal and a complement of the signal.

5. The apparatus of claim 4, wherein the signal is a digital signal.

6. The apparatus of claim 2, wherein the signal source comprises a logic gate.

7. The apparatus of claim 6, wherein the logic gate comprises a complementary metal-oxide semiconductor logic gate.

8. The apparatus of claim 2, wherein the pair of modulators comprise a first modulator and a second modulator and the optical unit is capable of producing a beam spot at the pair of modulators, the beam spot having a spot diameter, wherein the first modulator and the second modulator have a center-to-center separation distance of greater than about twice the spot diameter.

9. The apparatus of claim 2, wherein at least one of the pair of modulators comprises a photo-transistor.

10. The apparatus of claim 2, wherein at least one of the pair of modulators comprises a pn-junction.

11. The apparatus of claim 10, wherein the pn-junction comprises a lateral pn-junction.

12. The apparatus of claim 2, wherein at least one of the pair of modulators comprises a complementary metal-oxide semiconductor (CMOS) gate structure.

13. The apparatus of claim 11 wherein the complementary metal-oxide semiconductor (CMOS) gate structure comprises an p-channel gate structure.

14. The apparatus of claim 2, wherein the optical unit comprises:
    a first optical path; and
    a second optical path.

15. The apparatus of claim 14, wherein the first optical path comprises one or more optical elements capable of optically coupling an optical beam to the pair of optical modulators.

16. The apparatus of claim 14, wherein the first optical path comprises one or more optical elements capable of dividing the optical beam into a pair of optical beams and focusing the pair of optical beams onto the pair of modulators.

17. The apparatus of claim 14, wherein the first optical path comprises:
    a light source capable of generating an optical beam;
    a beam splitter;
    a prism; and
    a focusing lens, wherein the optical beam is optically coupled to the pair of modulators by the beam splitter, the prism,: and the focusing lens.

18. The apparatus of claim 17, wherein the prism comprises a Wollaston prism.

19. The apparatus of claim 14, wherein the second optical path comprises one or more optical elements capable of coupling each of the one or more optical signals to a detector.

20. The apparatus of claim 19, wherein the second optical path comprises:
    a focusing lens;
    a prism;
    a beam splitter;
    a waveplate;
    a polarizer; and
    a detector, wherein the optical beam is optically coupled to the detector by the focusing lens, the prism, the beam splitter, the waveplate, and the polarizer.

21. A method for testing a signal source, the method comprising:
    providing a first signal and a second signal to a pair of modulators, the first signal being generated by the signal source and the second signal being a complement of the first signal;

providing a optical beam to the pair of modulators to generate a modulated optical signal;

processing the modulated optical signal to form an electrical signal having an amplitude; and processing the electrical signal to determine whether the signal source is defective.

22. The method for testing a signal source of claim 19, wherein providing a first signal and a second signal to a pair of modulators, the first signal being generated by the signal source and a second signal being a complement of the first signal comprises:

providing the first signal comprising an oscillating digital signal; and providing the second signal comprising a complement of the oscillating digital signal.

23. The method of claim 21, wherein providing an optical beam to the pair of modulators to generate a modulated optical signal comprises:

using a laser to generate the optical beam;

using a lens to generate a pair of optical beams from the optical beam; and providing the pair of optical beams to the pair of modulators.

24. The method of claim 21, wherein processing the modulated optical signal to form an electrical signal having an amplitude comprises:

generating a difference signal from a pair of output signals produced by a pair of photodetectors.

25. The method of claim 21, wherein processing the electrical signal to determine whether the signal source is defective comprises:

measuring the amplitude of the electrical signal; and comparing the amplitude of the electrical signal to a predetermined threshold level, wherein if the amplitude is less than the predetermined threshold level, the signal source is defective.

26. Apparatus comprising:

a pair of optical modulators formed on a die, the pair of optical modulators capable of receiving a first signal from a signal source formed on the die and a second signal, the second signal being a complement of the first signal;

an optical beam coupled by a first optical path to the pair of optical modulators;

a detector optically coupled by a second optical path to the pair of modulators, the detector being capable of receiving and processing one or more optical signals from the pair of modulators; and a computerized unit coupled to the detector, the computerized unit for processing an electrical signal produced by the detector.

27. The apparatus of claim 26, wherein the first optical path comprises one or more optical elements capable of dividing the optical beam into two optical beams and focusing each of the two optical beams on each of the pair of modulators.

28. The apparatus of claim 26, wherein the first optical path is capable of producing a spot having a spot diameter at the pair of optical modulators, wherein the pair of optical modulators comprise a first optical modulator and a second optical modulator having a center-to-center distance equal to about twice the spot diameter.

29. The apparatus of claim 26, wherein the computerized unit is capable of being coupled to the die and capable of providing an input signal to the signal source.

* * * * *